United States Patent
Yamaguchi et al.

(10) Patent No.: US 6,888,162 B2
(45) Date of Patent: May 3, 2005

(54) ELECTRONIC APPARATUS HAVING POLYCRYSTALLINE SEMICONDUCTOR THIN FILM STRUCTURE

(75) Inventors: Shinya Yamaguchi, Mitaka (JP); Masanobu Miyao, Fukuoka (JP); Kiyokazu Nakagawa, Sayama (JP); Nobuyuki Sugii, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/354,121

(22) Filed: Jan. 30, 2003

(65) Prior Publication Data

US 2003/0132437 A1 Jul. 17, 2003

Related U.S. Application Data (62) Division of application No. 09/571,937, filed on May 16, 2000, now Pat. No. 6,545,294.

(30) Foreign Application Priority Data

May 18, 1999 (JP) ............................................. 11-136789

(51) Int. Cl.[7] .............................................. H01L 29/04
(52) U.S. Cl. .............................. 257/64; 257/66; 257/72; 257/75; 349/43
(58) Field of Search ............................... 257/64, 66, 70, 257/72, 75, 347, 351; 349/42, 43

(56) References Cited

U.S. PATENT DOCUMENTS 6,274,888 B1    8/2001   Suzuki et al.

FOREIGN PATENT DOCUMENTS

| JP | 08-031749 | 2/1996 |
|----|-----------|--------|
| JP | 08-316485 | 11/1996 |
| JP | 09-027452 | 1/1997 |
| JP | 10-055960 | 2/1998 |
| JP | 10-097993 | 4/1998 |
| JP | 10-291897 | 11/1998 |

*Primary Examiner*—Minh-Loan Tran
(74) *Attorney, Agent, or Firm*—Mattingly, Stanger & Malur, P.C.

(57) ABSTRACT

An electronic apparatus employs a polycrystalline semiconductor thin film structure formed of an insulating substrate and a plurality of polycrystalline layers laminated on the insulating substrate. A plurality of transistors are formed at the surface of the polycrystalline semiconductor thin film structure, each transistor being formed in a region of one of a plurality of crystal grains disseminated on the surface of the polycrystalline layers. A number of crystal grains in each of the polycrystalline layers is gradually reduced from a lower layer to an upper layer.

12 Claims, 7 Drawing Sheets

ELECTRONIC APPARATUS HAVING POLYCRYSTALLINE SEMICONDUCTOR THIN FILM STRUCTURE

This is a divisional application of U.S. Ser. No. 09/571,937, filed May 16, 2000, now U.S. Pat. No. 6,545,294.

BACKGROUND OF THE INVENTION

1. Field of the Invention

The present invention is directed to a polycrystalline semiconductor thin film layer and the method of production thereof, to a semiconductor device and the method of production thereof, and to an electronic apparatus, more specifically to an effective technology suitable for application in manufacturing transistors on the surface of polycrystalline semiconductor thin film layer (thin film transistors, TFT), polycrystalline layer for producing the thin film transistors, and electronic devices such as liquid crystal display devices or information processing devices incorporating the thin film transistors.

2. Description of the Related Art including information disclosed under 37 CFR 1.97 and 37 CFR 1.98:

Thin film transistors (TFT) used heretofore in the conventional image display devices and the like have been formed on a substrate material such as amorphous silicon or microcrystalline silicon made by means of plasma CVD on an insulating substrate of glass or quartz, with the polycrystalline silicon as element material made by means of melt and recrystallization method such as excimer laser annealing.

TFT made of polycrystalline silicon as material has field effect mobility of 100 to 200 cm2/Vsec due to decreased mobility caused by the carrier scattering in the grain boundary, in comparison with the field effect mobility ideal in the single-crystalline silicon (Japanese Unexamined Patent Publication No. H9-27452). The mobility is approximately 500 cm2/Vsec in single-crystalline silicon MOS-FET (S. M. Sze, Physics of Semiconductor devices, Second Edition, Wiley, P449)

The position and the number of crystal grains formed on the channel of a transistor is not controllable and hence the device performance is not uniform compared to the single-crystalline silicon MOS-FET (Japanese Unexamined Patent Publication No. H10-291897).

Numerous techniques have been devised and proposed for enlarging the size of grains and for controlling the position of them. These techniques include, among others, a method for solid-state crystallization of amorphous silicon using the islet-patterned nuclei formed on the insulating substrate (Japanese Unexamined Patent Publication No. H8-316485), a method for forming a deposited amorphous layer on a polycrystalline silicon and making use of polycrystalline silicon exposed on the surface as the nuclei for next solid phase crystallization (Japanese Unexamined Patent Publication No. H8-31749), a method for selectively producing amorphous layers from partially crystallized silicon thin film by using ion-implantation and making use of the residual crystallization as nuclei for recrystallization (Japanese Unexamined Patent Publication No. H10-55960), a method for accelerating the rate of crystallization by diffusion of metal elements (Japanese Unexamined Patent Publication No. H9-27452), and a method for gradually altering the irradiating energy and irradiation period of time of pulse laser annealing (Japanese Unexamined Patent Publication No. H10-97993).

BRIEF SUMMARY AND OBJECTS OF THE INVENTION

The methods as cited above of crystallization are considered not to be sufficiently maturated, resulting in the maximum grain size attainable of approximately 2 microns, with insufficient positional control of crystal grains. This is far from the practical usable size of thin film transistors, approximately 8 microns, required for the large size liquid crystal display panels, and the uniformity of device performance is not well achieved.

In addition, the crystal orientation of polycrystalline thus formed is disordered, so that there arises a problem of dispersion of device performance of field effect mobility depending on the crystal orientation.

The technologies cited above have not been successful to replace therewith the thin film transistor devices of low performance using the conventional amorphous silicon.

Thus, in order to achieve an image display device of larger size with higher performance and the like, there is a need to provide a technology for growing polycrystalline silicon for the element material of thin film transistors with a crystal orientation aligned to a specific direction (grain size larger than approximately 8 microns), and for finely controlling the position of crystal grains.

Therefore the present invention has been made in view of the above circumstances and has an object to overcome the above problems and to provide, in a semiconductor device formed by a plurality of thin film transistors on a polycrystalline layer, a manufacturing technology of the semiconductor device allowing the dispersion of characteristics such as field effect mobility of each of the thin film transistors and the like to be minimized.

Another object of the present invention is to provide a method for forming thin film transistors in a single crystal grain region by enlarging the size of crystal grains served for polycrystalline layer.

Still another object of the present invention is to provide a method for aligning the crystal orientation of crystal grains served for the polycrystalline layer.

Yet another object of the present invention is to provide a method for identifying the position of crystal grains served for a polycrystalline layer at higher precision.

Still another object of the present invention is to provide a polycrystalline layer of larger crystal grains in which the crystal orientation of crystal grains may be aligned and the position of crystal grains is identified at higher precision and transistors may be formed within a single crystal grain region, and a method for producing thereof.

Additional objects and advantages of the invention will be according to part in the description which follows and in part will be obvious from the description, or may be learned by practice of the invention. The objects and advantages of the invention may be realized and attained by means of the instrumentalities and combinations particularly pointed out in the appended claims.

In brief, the overview of the principal of the present invention disclosed in this application may be as follows:

(1) An electronic apparatus comprising,
   An insulating substrate (such as a glass substrate) and polycrystalline layer (polycrystalline silicon thin film) of n layers (where $n \geq 2$), sequentially laminated on the insulating substrate with crystal grains (silicon crystal grains) sparse on the surface of thin film, the number of the crystal grains at each of the layers in a given planar area being reduced from lower to upper layer. In other words the size of the crystal grains is enlarging from lower to upper layer, the interval of crystal grains also is enlarging from lower to upper layer. On the surface area of each of the polycrystalline layers from first to (n−1)th layer, projections each formed by a single crystal may be formed at a given interval, the crystal having a tip in a specific crystal orientation, the crystal grain served for the nth polycrystalline layer being a single crystal formed on the projections of the (n−1)th polycrystalline layer next thereto, and respective of projections of each layer is positioned beneath the projection of the (n−1)th polycrystalline layer. The interval of the projections is enlarging from lower to upper layer. The interval of the projections becomes twice for each lamination. The thickness of the polycrystalline layer is twice of the thickness of the lower next layer to the polycrystalline layer.

A polycrystalline layer as have been described above may be produced by (a) forming on an insulating substrate (glass substrate) an amorphous layer amorphous silicon layer) to crystallize so as to sparse crystal grains (silicon crystal grains) on the film layer surface to provide a polycrystalline layer (polycrystalline silicon layer); (b) anisotropically etching up to a predetermined depth the polycrystalline layer so as to obtain a specific crystal orientation and to selectively maintain the area of given interval; (c) anisotropically etching the entire surface of the polycrystalline layer to form projections made of solely the specific crystal orientation at the area of given interval; (d) forming an amorphous layer on the polycrystalline layer to crystallize to form larger crystal grains using the projections as nuclei; (e) repeating the step (b) through (d) by (n−1) times, such that for each of the process step part of projections is superposed just above some of the projections made in the preceding iteration, the interval between projections becomes larger than the preceding process, and the thickness of the amorphous semiconductor thin film is formed thicker than the preceding process iteration to provide a polycrystalline layer of n layers to form crystal grains served for the surface area of the nth layer. The interval between the projections and the thickness of the polycrystalline layer are formed so as to be twice for each layer.

(2) In the configuration (1) described above, the tips of the projections may be formed from a single crystal of Si1-xGex (0<x≦1) or silicide (silicide including at least one element selected from a group consisted of Fe, Co, Ni, Ru, Rh, Pd, Os, Ir, Rt, Sc, Ti, V, Cr, Mn, Cu, Zn, Au, Ag).

The polycrystalline layer as have been described above may be produced in accordance with the following method:

In the method of producing of the means (1) the tips of the projections may be formed from a single crystal of Si1-xGex (0<x≦1) or silicide (silicide including at least one element selected from a group consisted of Fe, Co, Ni, Ru, Rh, Pd, Os, Ir, Rt, Sc, Ti, V, Cr, Mn, Cu, Zn, Au, Ag) then the amorphous semiconductor thin film is formed.

(3) In the configuration (1) described above, the tips of the projections may be covered by a crystal film, other parts with exception of the tips of the projections may be covered by a film that will not become the nucleus of crystal.

The polycrystalline layer as have been described above may be produced in accordance with the method below.

In the method of production of the means (1), the amorphous semiconductor thin film may be formed after all surface with exception of the tips of the projections have been covered by a film that will not become the nucleus of crystals.

(4) A semiconductor device having a plurality of transistors on a polycrystalline layer, the polycrystalline layer being the polycrystalline layer according to any one of the means (1) to (3), and each of the transistors being formed respectively in a single crystal grain area.

In the method of producing such a semiconductor device, any one of polycrystalline layer according to the means (1) to (3) is used for producing each device in a crystal grain served therefor in the surface of nth layer.

(5) An electronic apparatus incorporating a semiconductor device having a plurality of transistors formed on a polycrystalline layer, the semiconductor device being of the semiconductor device in accordance with the means (4). For example the electronic apparatus may be a liquid crystal display device, the semiconductor device may comprises transistors driving pixels of the liquid crystal display panel and transistors constituting the peripheral driver circuit, and may be mounted behind the liquid crystal display panel of the liquid crystal display device.

(6) An electronic apparatus incorporating a semiconductor device according to the means (4), for example the electronic apparatus may be an information processing device, and transistors in the semiconductor device constitutes the central processing unit, cache circuit, memory circuit, peripheral circuit, I/O circuit, bus circuit and the like.

In accordance with the means (1), (a) When forming polycrystalline silicon thin film of each layer, crystal grains are grown on the projections that the crystal orientation provided in the lower layer is aligned, so that the crystal grains of which the crystal orientation is aligned will be formed.

(b) The interval between projections in each layer becomes twice larger in the next layer, as well as the thickness of amorphous layer for forming polycrystalline silicon thin film is formed twice thicker than the lower next layer, so that the size of crystal grains becomes larger in the next layer, therefore the size of crystal grains served for the surface of the nth polycrystalline layer may be for example about 8 microns, the size that a thin film transistor may be formed within a single crystal grain area.

(c) The crystal grains served for the nth layer are formed around the projections of lower layer, which projections are formed at the crystal grain formed on the projections of further lower layer, and so on until first layer. In addition, since the projections are formed by using conventional photolithographic and etching technologies, the positional precision of the projections may be enough accurate. In other words the projections at each layer may be identified by the photolithographic and etching technologies, and the position of crystal grains served may be selected from among any projections formed on the first layer, and the crystal grains will be formed on the projections of the (n−1)th layer superposed on thus selected projections so that the crystal grains to be served for may be formed at the position identified at higher precision. Thus by forming transistors in the area of crystal grains to be served, the position of transistors may be formed at higher precision.

In accordance with the means (2), in addition to the effect caused by the means (1), when manufacturing a semiconductor device, if the tip of the projections at each layer are formed by a single crystal of Si1-xGex (0<x≦1) or silicide (silicide including at least one element selected from a group consisted of Fe, Co, Ni, Ru, Rh, Pd, Os, Ir, Rt, Sc, Ti, V, Cr, Mn, Cu, Zn, Au, Ag) larger crystal grains may be grown with crystal orientation aligned on the projections.

In accordance with the means (3), in addition to the effect caused by the means (1), when manufacturing a semiconductor device, the tip of the projections at each layer is made of crystal film having a specific crystal orientation, and other part with exception of the tip of the projections is covered by a thin film that will not become the nucleus of crystal, so that on the projections larger crystal grains may be grown with crystal orientation aligned.

In accordance with the means (4), (a) When forming polycrystalline silicon thin film of each layer, a crystal grain is grown on a projection of lower layer with the crystal orientation aligned, crystal grains with crystal orientation aligned will be formed and the interval between projections at each layer becomes twice larger than the lower next layer, as well as the thickness of amorphous silicon thin film for forming polycrystalline silicon thin film is formed twice thicker than the lower next layer, so that the size of crystal grains becomes larger in the next layer, therefore the size of crystal grains served for the surface of the nth polycrystalline layer will be for example about 8 microns, the size that a thin film transistor may be formed within a single crystal grain area. As a result each thin film transistor is formed within one single crystal area, without crossing over the interface of grains, allowing the dispersion of characteristics of transistors to be minimized.

(b) Each of thin film transistors is formed respectively within a crystal grain area, which is made of a single crystal, so that the field effect mobility thereof will be as faster as approximately 500 cm2/Vsec as similar to a single crystal silicon MOS-FET.

(c) In each layer every projections may be identified by using photolithographic and etching technologies, the position of the crystal grains to be served for will be selected from within the projections formed on the first layer, and will also be formed on the projections at (n−1)th layer superposed on thus selected projections, the thin film transistors may be formed with the position thereof being identified at higher precision.

In accordance with the means (5), (a) An electronic apparatus incorporating a plurality of thin film transistors formed on a glass substrate is characterized in that each thin film transistor may run faster and in a manner more homogeneous, allowing an electronic apparatus having better performance and thinner size to be yielded.

(b) When transistors and peripheral driver circuit for driving pixels of the liquid crystal display panel in a liquid crystal display device is constructed by using thin film transistors formed on a glass substrate, since the thin film transistors runs faster and more homogeneous, the operating frequency of pixels in the liquid crystal display panel may be equalized, resulting in a finer display.

(c) Since the position of crystal grains served for forming thin film transistors may be identified at higher precision, the position of thin film transistors may be registered with pixels in the liquid crystal display panel, allowing to facilitate assembly.

In accordance with the means (6), since the thin film transistors formed on a glass substrate constitute the central processing circuit, cache circuit, memory circuit, peripheral driver circuit, I/O circuit, bus circuit and the like, thinner and high performance information processing device may be provided.

BRIEF DESCRIPTION OF THE SEVERAL VIEWS OF THE DRAWINGS

The accompanying drawings, which are incorporated in and constitute a part of this specification illustrate some embodiments of the invention and, together with the description, serve to explain the objects, advantages and principles of the invention. In the drawings.

FIG. 2a to FIG. 2f are cross-sectional views at each process step of manufacturing polycrystalline layer in accordance with the first preferred embodiment of the present invention;

FIG. 4a to FIG. 4c are cross-sectional views at each process step of manufacturing thin film transistors in accordance with the first preferred embodiment of the present invention;

DETAILED DESCRIPTION OF THE INVENTION

Some preferred embodiments of the present invention will be now described below in greater details with reference to the accompanying drawings. In the drawings, the similar members are designated to the identical reference numbers and the detailed description of the parts already described in the preceding embodiment will be omitted.

DESCRIPTION OF THE PREFERRED EMBODIMENTS

[First Embodiment]

FIG. 1 to FIG. 6 illustrates a novel manufacturing technology of polycrystalline layer and thin film transistors (TFT) made of silicon in accordance with one preferred embodiment (first embodiment) of the present invention.

Now referring to FIG. 2a to FIG. 2f, the method of manufacturing polycrystalline layer will be first described below in greater details.

Figure 1:
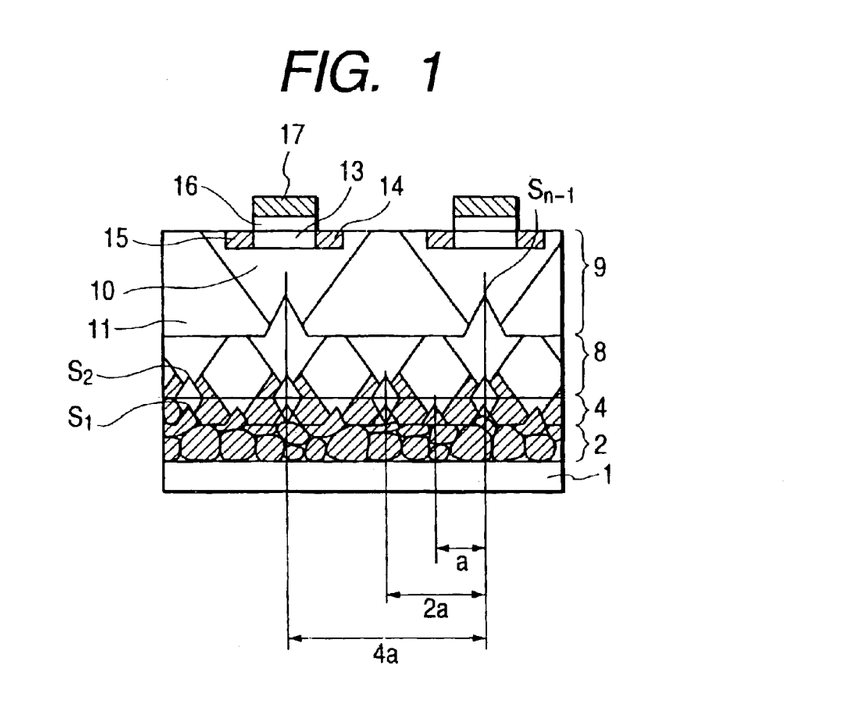
FIG. 1 is a schematic cross-sectional view of a semiconductor device having a plurality of thin film transistors in accordance with a preferred embodiment (first embodiment) of the present invention.
Figure 2A:
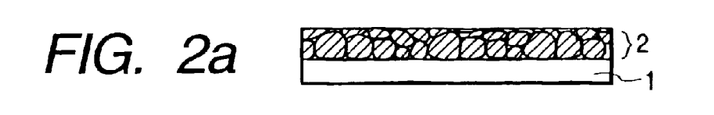

As shown in FIG. 2a, an insulating substrate 1 is prepared. The insulating substrate 1 may be of a glass substrate, for example. On one surface side of the insulating substrate 1, amorphous silicon (amorphous semiconductor) is deposited at the thickness of 0.5 microns, then the substrate is annealed by means of excimer laser (with energy density of 360 mJ/cm2) at the substrate temperature 350 degrees Cercius to form polycrystalline layer 2 of first layer constituted of polycrystal having mean grain size of 0.1 through 0.3 micron (crystallization process a). Although the size of crystal grains formed at this phase may be varied in the range from 0.1 micron to 1.0 micron if desired by controlling the energy density of the laser, in this specification a case of 0.1 to 0.3 micron will be discussed.

Figure 2B:
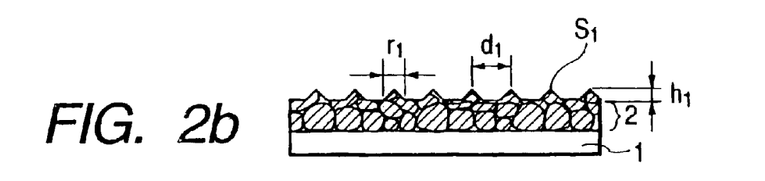

Next, as shown in FIG. 2b, anisotropic etching solution (such as hydrazine, tetramethyl ammonium hydroxide and the like) is used to etch the first layer polycrystalline layer (first layer polycrystal film) 2 by the depth of 0.1 micron, while selectively maintaining a specific orientation (orientation {100}, {110} or {111}). Then a photomask is used to mask a specific area of interval d1=0.3 micron, diameter r1=0.15 micron, other area will be further etched by the depth 0.2 micron, with an etching solution which does not affect to the crystal orientation (such as hydrofluoric acid and the like). This yields a series of first layer projections S1 with the interval d1=0.3 micron and height h1=0.3 micron made of a specific crystal orientation shown in FIG. 2b on the first polycrystalline layer 2 (process b).

Figure 2C:
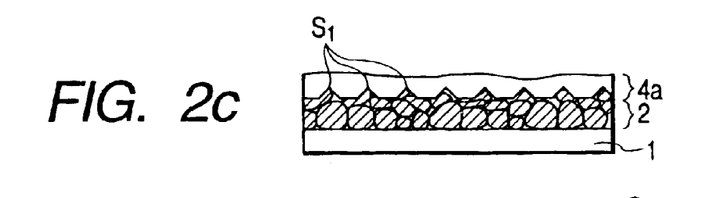

Thereafter, as shown in FIG. 2c, after lowering the substrate temperature to about a room temperature, another amorphous semiconductor thin film 4a constituting the second layer of amorphous silicon is deposited by means of CVD method to the thickness 0.3 micron on the first layer polycrystalline layer 2 (process c).

Figure 2D:
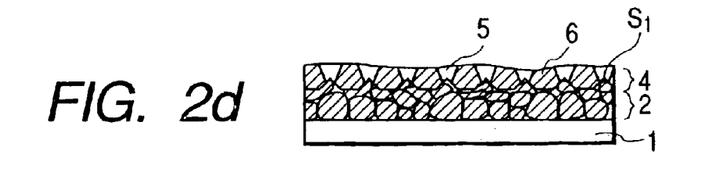

Then, a laser annealing is performed again under the same condition as the process a to crystallize into the amorphous silicon with the first layer projections S1 acting as nuclei. The crystallization will be occurred not only at the tip of the layer projections S1 but also everywhere in the interface to the amorphous silicon layer, at the same time. The growth surfaces of crystals having different crystal orientation each from other may collide and compete at this time. However, due to the property that a second growth surface having another crystal orientation may not penetrate into the area already crystallized, a single crystal 5 of the second layer with crystal orientation aligned based on the nuclei at the tip of layer projections S1 will be arrived at first to the surface. Thus almost all of other polycrystals 6, derived from crystallization based on the other polycrystals are not allowed to reach to the second layer surface. Then, as shown in FIG. 2d, a second layer polycrystalline layer 4 will be formed, which comprises single crystals 5 (crystal grains) of grain size of approximately 0.3 micron with crystal orientation aligned at the most part of the surface (process d).

Figure 2E:
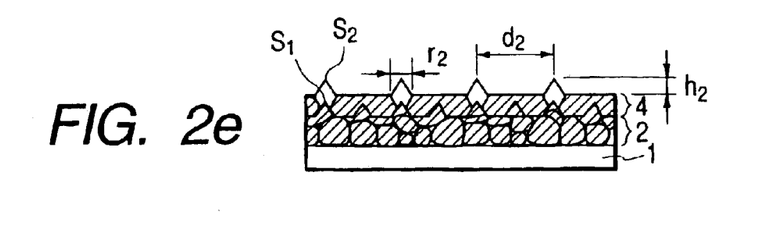

Next, as shown in FIG. 2e, after another anisotropic etching, which is done in the same manner as the process b above to the second layer polycrystalline layer 4, a photomask having twice cycle of the first layer projections S1 (process b), with the pitch (interval) d2=0.6 micron, diameter r2=0.3 micron, is used to form a second layer projection S2 having twice height h2=0.6 micron of the first layer projections S1 (process e) at the position just above the first layer projections S1.

Thereafter, process c through process e are repeated for a plurality of times to form a nth polycrystalline layer 9 (the nth polycrystalline layer) ($n \geq 2$). Here with respect to the projection S, S1, S2, ..., Sn-1 are each formed in respective layer, and ultimately on the projection Sn-1, a single crystal 10 will be formed. The single crystal 10 will be formed just above the projection Sn-1, which is formed on the (n-1)th layer polycrystalline layer next to the upper nth layer, and beneath the projection Sn-1 a series of projections Sn-2, ... S2, and S1 are formed in-line. Namely, the single crystal 10 will be formed on the projection just above the several lower projection on the first projection S1 formed on the polycrystalline layer 2, while at the same time several projections S2, ..., Sn-1 are sequentially interposed between the first layer projections S1 and the single crystal 10. In other words, what is important is to perform photolithographic and etching processes for forming such laminated and aligned projections so as to ultimately yield the maximum size of crystal grains at each of layers.

In the drawings the reference numeral 8 designates to the (n-1)th layer polycrystalline layer.

Figure 2F:
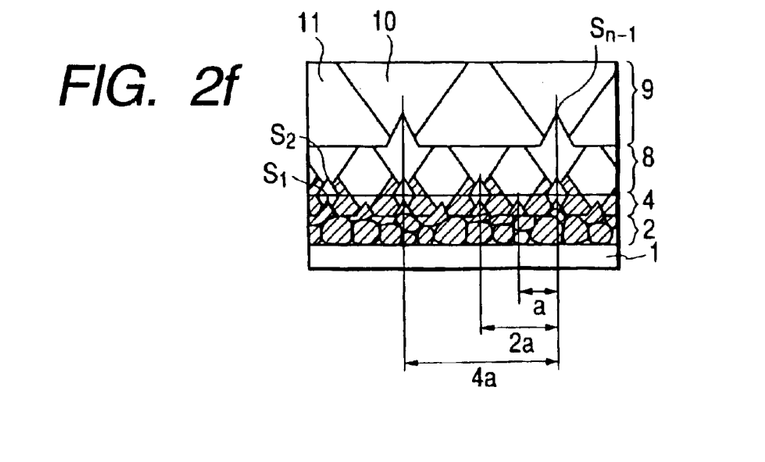

The production method as have been described above may form single crystals 10 of the nth layer at the mean grain size of 0.3 by 2 to the (n-2)-th microns (namely $0.3 \times 2^{n-2}$ microns) at the surface of the nth polycrystalline layer 9 as well as the polycrystal 11 of the nth layer at the remaining gaps. As shown in FIG. 2f, the interval between projections in the next layer increases twice of the interval of lower layer for each deposition (the interval increases as a, 2a, 4a, and so forth). The diameter of the single crystal 10 (crystal grain) may be formed to the desired size by appropriately selecting the number of layers n, and the interval and aperture of the projections.

The drawings shows an example where n=4, for the purpose of illustration. Thus the Sn-2 will be S2, the projection S is provided in the order of S1, S2, Sn-1 from the first to nth layer as well as the projection S are sequentially superposed thereon in the order of S1, S2, Sn-1 from the lower to upper layer beneath the lower center of a crystal grain (single crystal 10) to be served.

Then, the single crystal 10 will be the crystal grain to be served. Thus on the single crystal 10 a transistor as will be described later will be formed. In this case the transistor will be formed without crossing over the grain boundary of single crystal 10. This implies that the single crystal 10 should be formed in the size that a transistor may be formed therewithin, and the size thereof will be determined by the size of polycrystals in the first layer and the number of layers deposited thereon, as have been described above.

In the present preferred embodiment, a case in which single crystals 10 of diameter of 8 microns with four layer are formed will be discussed. Now the growth of crystals will be described below based on the data obtained from experiments conducted by the author.

Figure 5:
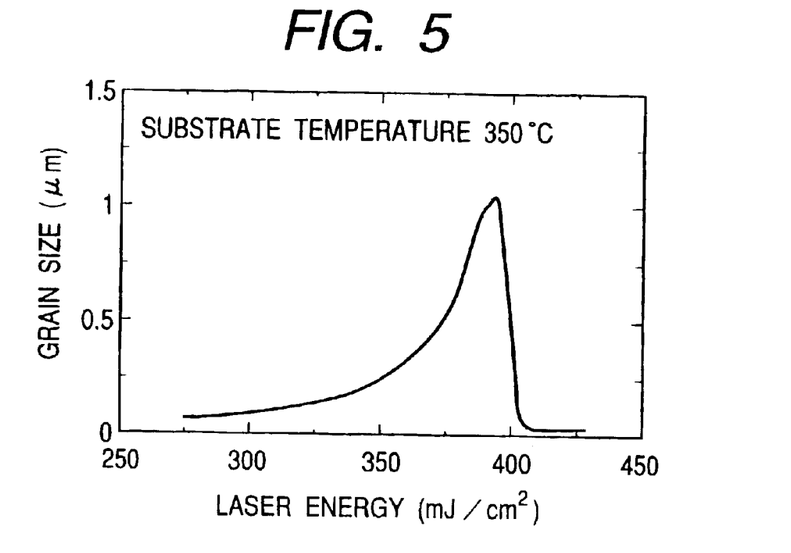
FIG. 5 is a graph illustrating the correlation of energy density of excimer laser used for annealing of amorphous layer with the size of crystal grains formed by the annealing in the production of polycrystalline layer in accordance with the first preferred embodiment of the present invention.

Referring now to FIG. 5, there is shown a correlation between the grain size of the polycrystalline layer 2 of first layer (first polycrystalline thin film) providing first nuclei in the present invention and the intensity of laser energy used for annealing the film. The control of grain size provided by the present invention allows parameters such as interval of photomask in the following process, thickness of film, the number of times of repetition of the crystallization process and the like to be determined so as to control the grain size of the nth single crystals 10 which will be ultimately formed. At the substrate temperature 350 degrees Cercius, by varying the laser energy density in the range of 280 to 390 (mJ/cm2) the crystal grain size of the first layer polycrystalline layer 2 may be altered in the range from 0.1 micron to 1.0 micron.

Figure 6:
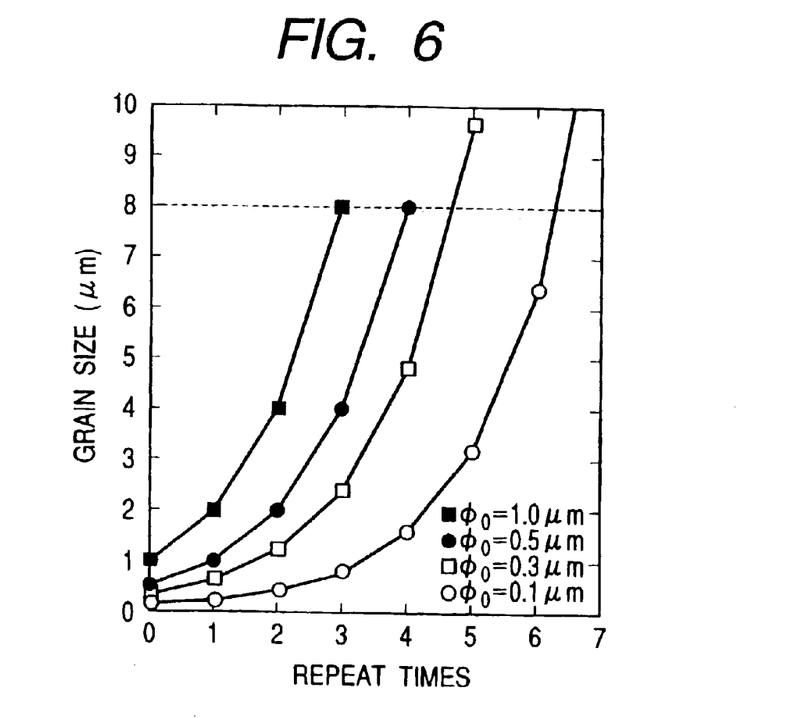
FIG. 6 is a graph illustrating the correlation of the number of repeating times of crystallization process with the size of crystal grains formed in the production of polycrystalline layer in accordance with the first preferred embodiment of the present invention for various sizes of grain in a silicon layer.

FIG. 6 shows how the grain size formed in the crystallization process in accordance with the present invention is increased along with the number of times of repetition of the crystallization process in various conditions of the grain size $\Phi$ 0 of the first layer polycrystalline layer 2. In order to obtain a crystal of the size of approximately 8 microns, which size is necessary for forming a practical thin film transistor, if the grain size of the first layer polycrystalline layer 2 $\Phi$ 0=0.3 micron, then five times of repeating crystallization process are required. In the future if the first layer polycrystalline layer 2 (first layer silicon thin film) with $\Phi 0=2$ microns is achieved by for example the improvement of uniformity of laser density distribution, the repetition of crystallization process will be reduced up to two times.

Figure 3:
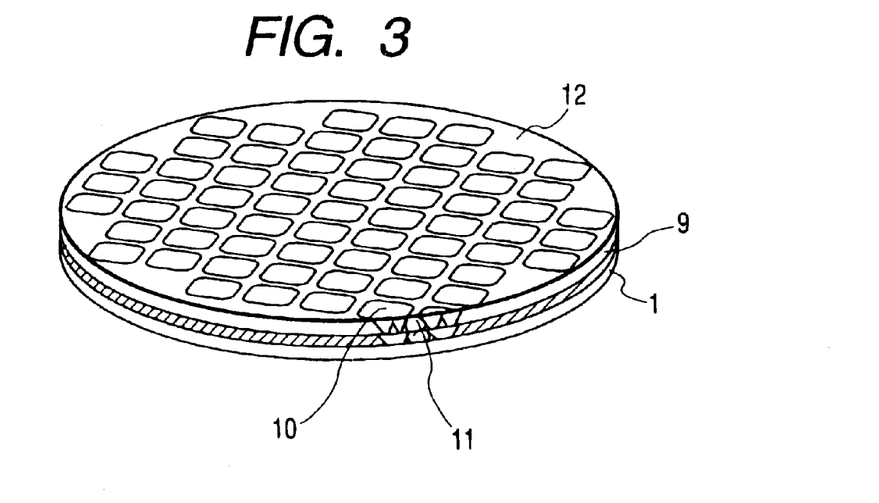
FIG. 3 is a schematic diagram of polycrystalline layer in accordance with the first preferred embodiment of the present invention.

FIG. 3 shows a polycrystalline layer (polycrystalline silicon thin film) 12 thus obtained. The polycrystalline layer 12 may be provided to the market in this configuration.

Now referring to FIG. 4, a method of producing transistors (thin film transistors) by means of the polycrystalline layer 12 thus provided will be described below in greater details. For the sake of illustration which follows, the diameter of the single crystal 10 of FIG. 2f and FIG. 3, as have been described above, is assumed to be 8 microns worth.

Figure 4A:
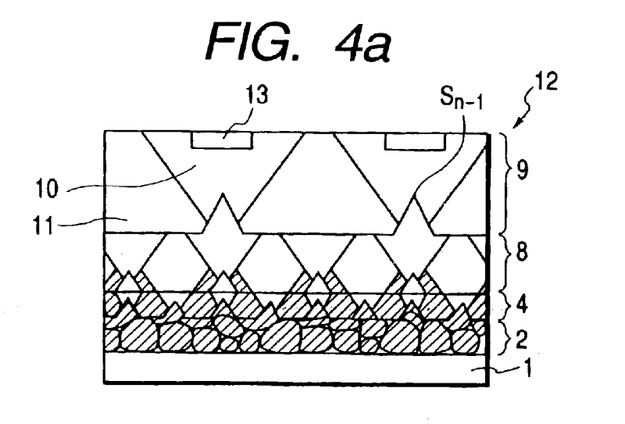
Figure 4B:
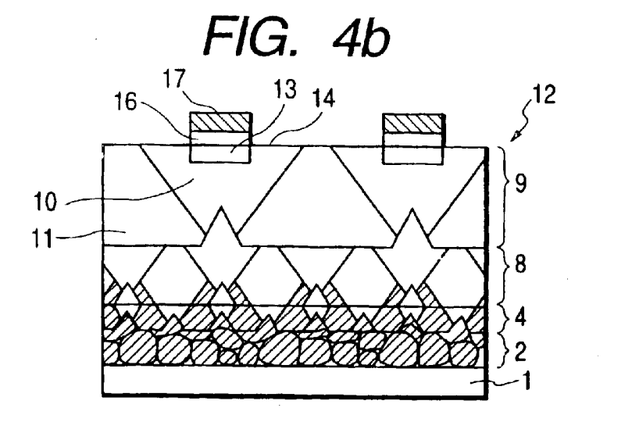

As shown in FIG. 4a, at the center of the single crystal 10 (crystal grain) at the topmost (the nth) layer of the polycrystalline layer 12, B ions will be implanted to form p type channel 13. Prior to forming this channel 13, the surface of the polycrystalline layer may be flatten by performing surface treatment if required. Next, on the surface of the polycrystalline layer 12, heat oxidation film (SiO2 film) and Al film are sequentially formed, and selective etching of the SiO2 and Al films may form a gate insulation film 16 on the channel 13 and a gate electrode 17 superposed thereon and conformed thereto as shown in FIG. 4b.

Figure 4C:
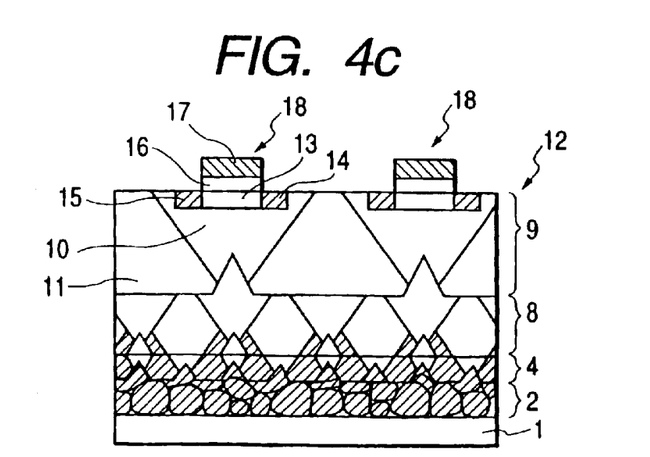

Next, as shown in FIG. 4c, the gate electrode 17, gate insulation film 16 and a photoresist film not shown in the figure are used as masks to selectively inject As ions to form a source region 14 at one end of the channel 13, and to form a drain region 15 at the other end to constitute a self-aligned transistor (thin film transistor) 18.

In the following process, an interlayer insulation layers, lead wirings of electrodes, terminals for electrodes connecting to outside, as well as passivation layer will be formed, however the description thereof will be omitted herein.

In this manner a transistor 18 may be formed in the region of a single crystal 10 (crystal grain) For each transistor 18 the channel 13 is all formed from silicon of single crystal with crystal orientation aligned, allowing the characteristics of each of transistors to be improved and the performance of each of transistors to be approximately at the same level.

A predetermined semiconductor device 40 may be produced by forming on a predetermined single crystal 10 on an insulating substrate (glass substrate) 1 a transistor (thin film transistor) 18, connecting a transistor to another with a wiring, and providing external terminals at the given sections such as edges of the insulating substrate 1.

In accordance with the first preferred embodiment following effects will be produced:

(1) when forming polycrystalline silicon thin film of each of layers crystal grains are to be grown on the projections S provided in the lower layer and having crystal orientation aligned, so that the crystal grains having crystal orientation aligned may be yielded.

(2) The interval between projections in each of layers will become twice in the next layer than the lower layer, and the thickness of amorphous layer for forming polycrystalline layer will be twice of the thickness, the crystal grains will be larger in the next layer than the preceding layer, so that the size of crystal grain to be served for at the surface of the nth polycrystalline layer may be of diameter of approximately 8 microns, enough for forming a thin film transistor within a single crystal grain area. Also, by increasing the lamination the diameter of the crystal grains may be further enlarged.

(3) the crystal grains to be served in the nth layer will be formed above the center of the projections Sn−1 of the adjacent lower layer, and the projections Sn−1 will be formed on the crystal grains formed on the projections of its lower next layer, and so forth up to the lowest first layer. Since the projections are formed by means of conventional photolithographic and etching technologies, the positional precision of projections may be higher precision. In other words the projections in each layer may be identified by the photolithographic and etching technologies, the position of the crystal grains to be served for maybe selected from projections formed in the first layer, and formed on the projections of the (n−1)th layer superposed conforming to the selected projections, so that the crystal grains to be served may be formed with the position thereof being identified at higher precision. Therefore the position of transistors may be identified at higher precision by forming these transistors in the crystal grain regions to be served.

(4) in accordance with the present preferred embodiment, a polycrystalline semiconductor thin film of larger grain size may be provided, in which the crystal orientation of crystal grains may be aligned and the position of crystal grains may be identified at higher precision, and transistors may be formed in a single grain area.

(5) since transistors may be formed in a crystal grain area formed by a single crystal silicon, each of transistors will be formed without crossing over the grain boundary so that a transistor will be formed within a single crystal grain, allowing the dispersion of characteristics between transistors to be minimized.

(6) since each of transistors may be formed within the crystal grain of a single crystal, the field effect mobility will be increased to approximately 500 cm2/Vsec, as faster as a single crystal MOS-FET.

(7) The projections in each layer may be identified by using photolithographic and etching technologies, and the position of the crystal grains to be served for may be selected from projections formed in the first layer, and formed on the projections of the (n−1)th layer superposed conforming to the selected projections, so that the thin film transistors may be formed with the forming position thereof identified at higher precision.

[Second Embodiment]

Figure 7:
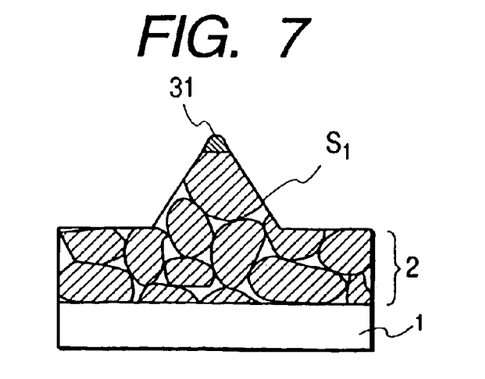
FIG. 7 is a schematic cross-sectional view of the structure of a projection in a method of manufacturing semiconductor device in accordance with another preferred embodiment (second embodiment) of the present invention.

FIG. 7 shows a schematic cross-sectional view illustrating the structure of a projection in a method of manufacturing a semiconductor device in accordance with another preferred embodiment (second embodiment) of the present invention.

In the preceding, first preferred embodiment, the first layer projection S1 with sharp tip was formed by etching, the first layer projections S1 may have no problem for embodying the effect of the present invention only if the tip thereof is constituted of a single crystal having a specific crystal orientation, even when other members (such as the base) are polycrystalline with a variety of crystal orientations. This means that instead of a corn shaped projection as have been described above in the preceding embodiment, any other structures may be allowed which has a projection of a single crystal with a crystal orientation aligned from other polycrystalline area in any shape.

In the present second preferred embodiment, at the tip of first layer projections S1 in the preceding first preferred embodiment, a PCVD method and a mask are used to deposit a single crystal 31 constituted of a Si1-xGex grain ($0 \leq x \leq 1$) or a silicide grain (silicide including at least one element selected from a group consisted of Fe, Co, Ni, Ru, Rh, Pd, Os, Ir, Rt, Sc, Ti, V, Cr, Mn, Cu, Zn, Au, and Ag) at the thickness of 0.05 micron prior to crystallize only the tip by laser annealing. In this manner the single crystal 31 of Si1-xGex grains or the silicide metal at the tip will be crystallized to a single crystal in the same crystal orientation as the single crystal with the crystal orientation aligned, which constituted the first layer projections S1.

Since Si1-xGex or the silicide metal has lower crystallization temperature when compared to the pure silicon (c.f., silicon approximately 600 degrees Cercius, germanium approximately 300 degrees Cercius, nickel silicide approximately 550 degrees Cercius), if the crystallization to an amorphous layer, in a manner similar to that of the previous first preferred embodiment, with this metal used as new nuclei, the crystallization will be faster and at lower substrate temperature. This procedure has an effect of protecting a glass substrate which is likely to be heat distorted, allowing the reliability to be improved in an image display device of large size as will be described later and the like.

The semiconductor device having TFTs produced in accordance with the second embodiment will have the effects similar to those as have been described in the preceding first embodiment. The polycrystalline thin film 12 produced in this method may be commercially delivered.

[Third Embodiment]

Figure 8:
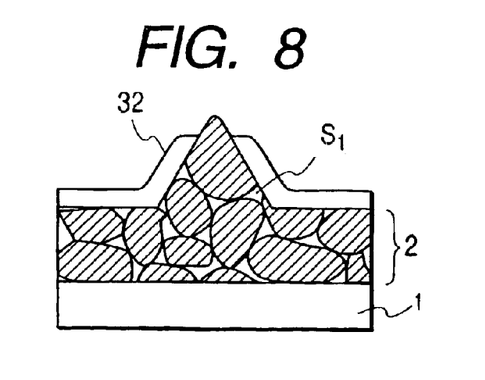
FIG. 8 is a schematic cross-sectional view of the structure of a projection in a method of manufacturing semiconductor device in accordance with still another preferred embodiment (third embodiment) of the present invention.

FIG. 8 shows a schematic cross-sectional view of the structure of a projection in a method of manufacturing semiconductor device in accordance with still another preferred embodiment (third embodiment) of the present invention.

The third preferred embodiment is still another structure of projection, as similar to the second preferred embodiment as have been described above. In the third preferred embodiment only the tips of the first layer projections S1 in accordance with the first preferred embodiment are used as openings, and the reminder are masked by using CVD method and a mask to deposit 0.1 micron thick of SiO2 layer 32. By using these openings as new nuclei to crystallize to the amorphous layer as similar to the first preferred embodiment, the growth of crystals derived from other polycrystals may be significantly prevented. Therefore a single crystal of larger grain size may be formed with thinner amorphous layer, resulting in shorter process time for depositing amorphous layers.

The semiconductor device having TFTs produced in accordance with the third embodiment will have the effects similar to those as have been described in the preceding first embodiment. The polycrystalline thin film 12 produced in this method may be commercially delivered.

[Fourth Embodiment]

Figure 9:
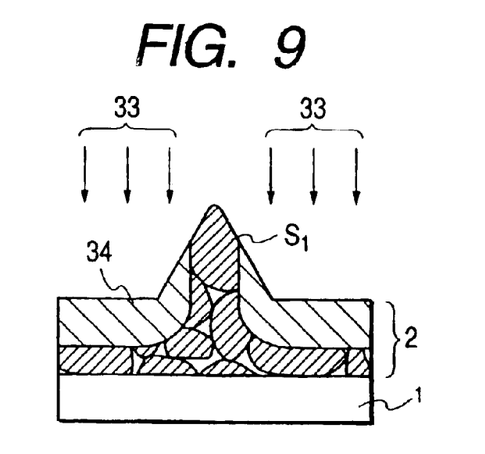
FIG. 9 is a schematic cross-sectional view of the structure of a projection in a method of manufacturing semiconductor device in accordance with yet another preferred embodiment (fourth embodiment) of the present invention.

FIG. 9 is a schematic cross-sectional view of the structure of a projection in a method of manufacturing semiconductor device in accordance with yet another preferred embodiment (fourth embodiment) of the present invention.

The fourth preferred embodiment is still another structure of projection, as similar to the second preferred embodiment as have been described above. In the fourth preferred embodiment only the tips of the first layer projections S1 in accordance with the first preferred embodiment are protected by a mask to inject Si ions 33 into the rest to form an amorphous layer 34 produced by ion-implantation into the crystalline layer. Then the tips, which are not covered by an amorphous layer, may be used as new nuclei to crystallize to the amorphous layer as similar to the preceding first preferred embodiment, so that the growth of crystals derived from other polycrystals may be considerably delayed. Therefore a single crystal of larger grain size may be formed with thinner amorphous layer, resulting in shorter process time for depositing amorphous layers.

The semiconductor device having TFTs produced in accordance with the fourth embodiment will have the effects similar to those as have been described in the preceding first embodiment. The polycrystalline thin film 12 produced in this method may also be commercially delivered.

[Fifth Embodiment]

Figure 10:
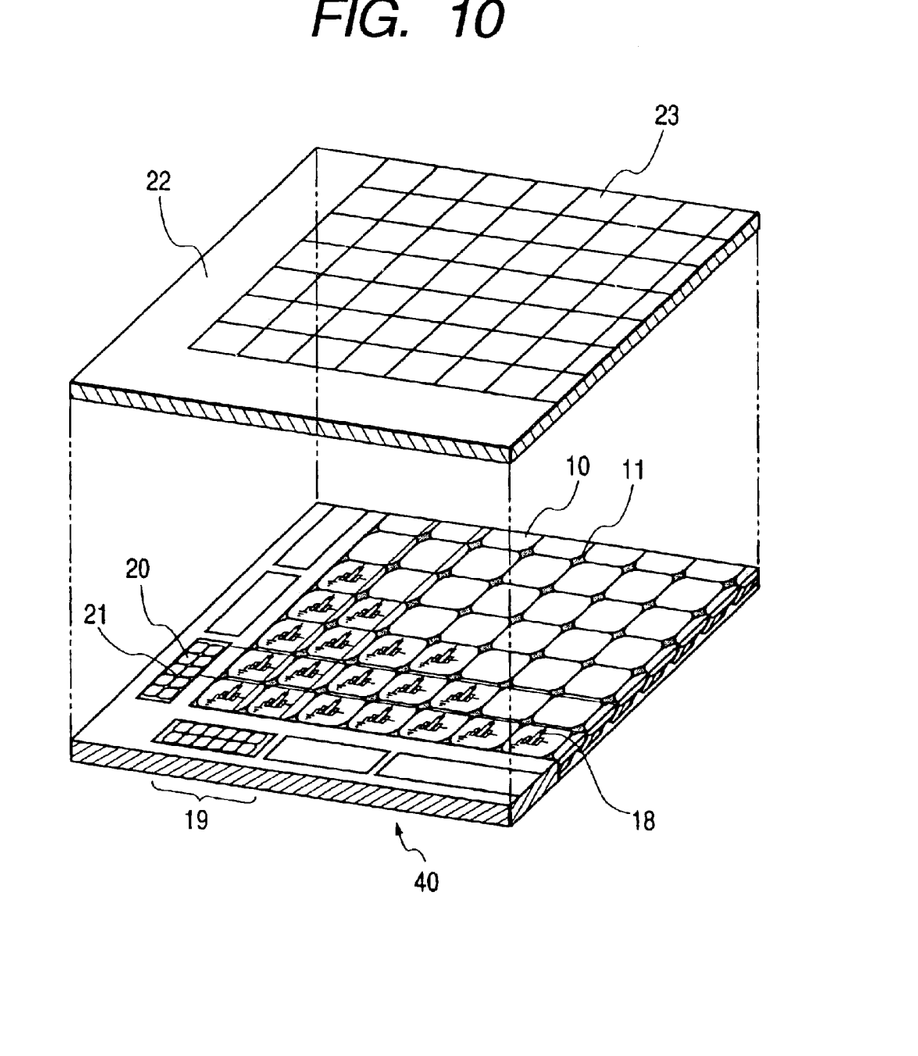
FIG. 10 is a schematic perspective view of the structure of projections in a method of manufacturing semiconductor device in accordance with still another preferred embodiment (fifth embodiment) of the present invention.

FIG. 10 is a schematic perspective view of the structure of projections in a method of manufacturing semiconductor device in accordance with still another preferred embodiment (fifth embodiment) of the present invention.

In this fifth preferred embodiment an exemplary case of incorporating into an image display (electronic apparatus) a semiconductor device 40 having a plurality of transistors (thin film transistors) 18 formed on the insulating substrate 1 will be described.

FIG. 10 shows a perspective view illustrating part of an exploded image display apparatus. As shown in FIG. 10, the image display has a structure in which fluoro-luminescence tubes, and a display panel 22 having liquid crystal enclosed within glasses and pixels 23 may be mounted on the semiconductor device 40 in accordance with the first preferred embodiment of the present invention having a series of transistor arrays formed at the upper side of an insulating substrate 1. Each of pixels 23 corresponds to a transistor 18 respectively as the pixel-driving element, the source electrodes of transistors 18 are connected to the pixel electrodes of the pixels 23 by registration.

The peripheral area at the circumferences of the area of arrays of pixels 23 comprises the peripheral circuit 19 including address decoders, digital/analog converters, controllers and the like. In such a configuration the crystal grains to be served will be enlarged while the interface area between crystal grains will be comparably shrunk so that the degradation of performance caused by the scattering in the grain boundary will be reduced to minimum.

In addition, since the channel region of transistors 18 are always provided on the single crystal silicon, a field effect mobility as high as a conventional silicon MOS-FET may be accomplished to allow a high performance image display.

Also, by leaving polycrystals 11 everywhere between a crystal grain (single crystal 10) and a crystal grain (single crystal 10) forming the transistor 18, the polycrystals 11 may act as thermal buffer which protects against the cleavage of single crystals 10 with respect to the distortion of glass substrate caused by an abrupt change in temperature and the like, allowing the reliability to be improved in a large size image display device.

For the peripheral driver circuit 19, the single crystals 20 different in the grain size from the single crystals 10 of the nth polycrystalline layer and the polycrystals 21 different in the surface area from the polycrystals 11 in the nth layer may be controllably coexisted by controllably changing the density of laser energy upon annealing, interval of photomask, thickness of thin film and the like.

When similar transistors are formed on these single crystals 20, transistors having a variety of grain sizes and functionalities may be integrated on one single substrate. By selecting a polycrystalline silicon thin film of the grain size suitable for accomplishing the transistors in compliance with the required degree of integrity and performance as such, and by forming them on one single substrate, an image display device which has high performance and high integrity more than any conventional image display while on the other hand which is low cost and highly reliable. For example, in accordance with the present preferred embodiment, if polycrystalline silicon used for the material of thin film transistors may be crystallize into larger grains (more than 8 microns of grain size) with the crystal orientation aligned, as well as the position of crystal grains may be controllably defined at high precision at the predetermined location, an image display device having larger surface area (larger than 15 inches) may be achieved with high performance and high reliability.

[Sixth Embodiment]

Figure 11:
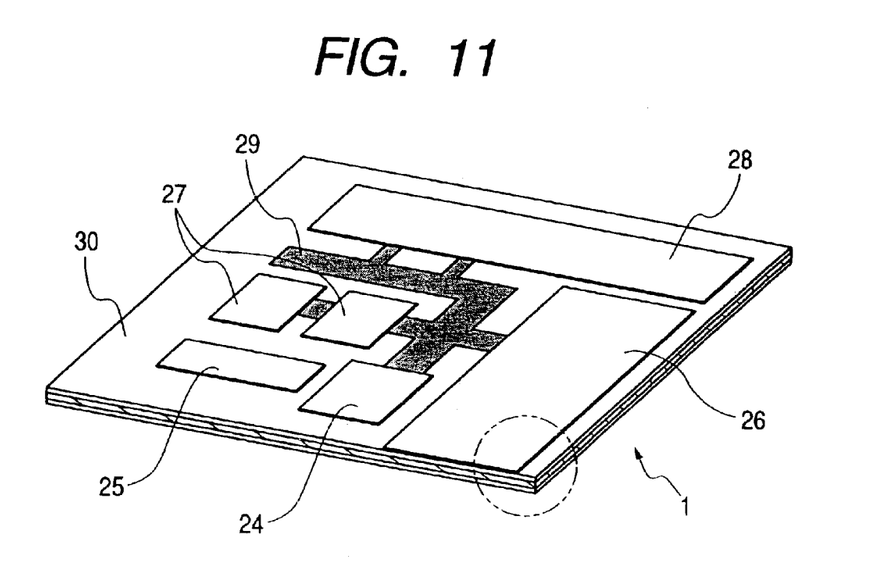
FIG. 11 is a schematic perspective view of the structure of projections in a method of manufacturing semiconductor device in accordance with yet another preferred embodiment (sixth embodiment) of the present invention.
Figure 12:
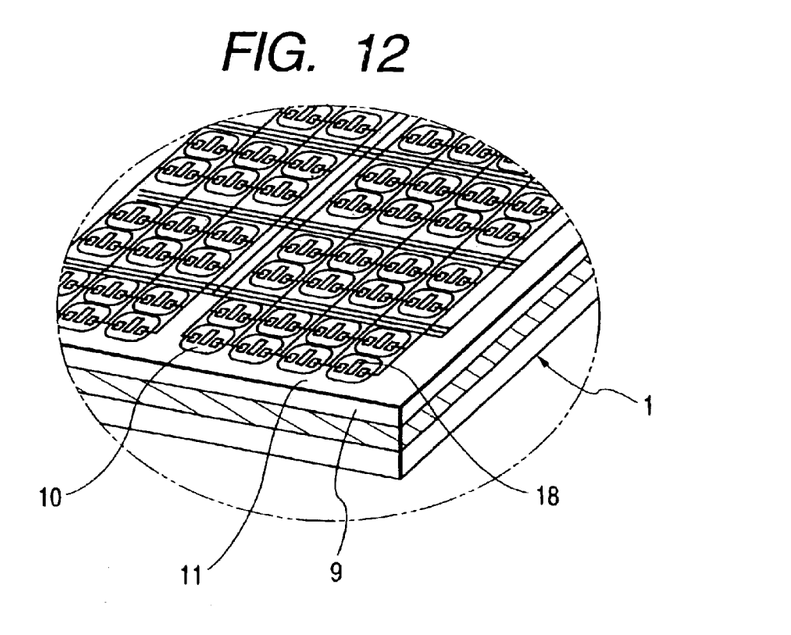
FIG. 12 is an enlarged schematic end view of the section in FIG. 11 encircled by the double dotted line.

FIG. 11 is a schematic perspective view of the structure of projections in a method of manufacturing semiconductor device in accordance with yet another preferred embodiment (sixth embodiment) of the present invention, and FIG. 12 is an enlarged schematic end view of the section in FIG. 11 encircled by the double dotted line.

In the present sixth embodiment, the crystal grains (single crystals 10) to be served are formed on one surface of the insulating substrate 1 i.e., a glass substrate 1, in a manner similar to the first preferred embodiment as have been described above. In this case crystal grains to be served may be partially formed larger than other grains.

An information processing device 30 is comprised of several circuits formed on the surface of the insulating substrate 1. As shown in FIG. 12, a predetermined transistor 18 and passive element not shown are respectively formed in each region of the single crystal 10 on the nth polycrystalline layer 9 formed on the surface of the insulating substrate 1.

Each circuit is connected through wirings not shown in the drawings. External terminals are provided on the surface of the insulating substrate 1, or connectors and the like are attached on the circumferential edges of the substrate.

In addition, circuits and wirings on the surface of the insulating substrate 1 are covered by a passivation layer for the protection thereof.

The information processing device 30 comprises for example a central processing unit 24, and a memory circuit 26, I/O circuit 28, and peripheral driver circuit 27, each of which is connected to the central processing unit 24 through a bus circuit 29 respectively, and a cache circuit 25 connected to the central processing unit 24.

In such an information processing device 30 each transistor should be formed in the polycrystalline layer, however, the field effect mobility will be faster than the transistors formed in the conventional polycrystalline layer because each of the transistor may be formed in the crystal grain areas each formed by a single crystal, as well as the manufacturing cost may be saved because the device is fabricated on the glass substrate which is less expensive when compared to the conventional single crystal substrate.

The foregoing description of the preferred embodiments of the invention has been presented for the purposes of illustration and description. It is not intended to be exhaustive or to limit the invention to the precise form disclosed herein, and modifications and variations are possible in light of the above teachings or may be acquired from practice of the invention.

The embodiments chosen and described herein in-order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

While some preferred embodiments of the present invention made by the inventor has been disclosed with respect to a specific field of application of image display devices and information processing devices, which is the background utility field thereof, it should be recognized by those skilled in the art that the present invention is equally applicable to any other electronic devices.

The present invention may be applied at least to an electronic apparatus which may be produced by using the polycrystalline semiconductor thin film.

The effect obtainable by some exemplary embodiments of the present invention disclosed herein may be summarized in brief as follows:

In accordance with the present invention the grain size of polycrystalline silicon used as the material of thin film transistors may be enlarged (more than 8 microns of diameters) with the crystal orientation aligned, and the position of crystal grains may be controllably deposited at the predetermined location at high precision to allow image display devices of large size (larger than 15 inches) to be high performance and high reliability.

What is claimed is:

1. A liquid crystal display device, comprising:
   a semiconductor device having a plurality of transistors formed at a surface of a polycrystalline semiconductor thin film structure formed of an insulating substrate and n polycrystalline layers (n≧2) laminated on said insulating substrate, with crystal grains disseminated on the surface thereof, the number of the crystal grains in each of the polycrystalline layers being gradually reduced from a lower layer to an upper layer, each of said transistors being formed in a region of one of said crystal grains, and said semiconductor device being attached to a liquid crystal display panel.

2. A liquid crystal display device according to claim 1, wherein:
   said insulation substrate is a glass substrate.

3. A liquid crystal display device according to claim 2, wherein:
   said semiconductor device comprises transistors for driving each pixel in the liquid crystal display panel attached to the semiconductor device, and transistors for configuring peripheral driver circuitry.

4. A liquid crystal display device, according to claim 1, wherein:
   the surface of the first to (n−1)th layer of said polycrystalline layers comprises projections at a predetermined interval, said projections each having a Lip at a specific crystal orientation, the crystal grains on the nth polycrystalline layer are single crystals formed just above the projections of said (n−1)th polycrystalline layer, the projections of each of layers are registered at the locations of said projections in said (n−1)th polycrystalline layer.

5. A liquid crystal display device according to claim 4, wherein:

the pitch of said projections is gradually larger in upper layers.

6. A liquid crystal display device according to claim 5, wherein:

the tip of said projections is comprised of a single crystal of Si1-xGex (0<x≦1) or silicide alloy of Si and at least one element selected from a group consisting of Fe, Co, Ni, Ru, Rh, Pd, Os, Ir, Rt, Sc, Ti, V, Cr, Mn, Cu, Zn, Au, Ag.

7. A liquid crystal display device according to claim 6, wherein:

the tip of said projections is a crystalline layer having a specific crystal orientation, whereas said projections except for said tip are covered by a layer which is not a candidate of nuclei.

8. A liquid crystal display device according to claim 6 wherein:

said insulation substrate is a glass substrate.

9. A liquid crystal display device according to claim 5, wherein:

the tip of said projections is a crystalline layer having a specific crystal orientation, whereas said projections except for said tip are covered by a layer which is not a candidate of nuclei.

10. A liquid crystal display device according to claim 4, wherein:

the tip of said projections is comprised of a single crystal of Si1-xGex (0<x≦1) or silicide alloy of Si and at least one element selected from a group consisting of Fe, Co, Ni, Ru, Rh, Pd, Os, Ir, Rt, Sc, Ti, V, Cr, Mn, Cu, Zn, Au, Ag.

11. A liquid crystal display device according to claim 4, wherein:

the tip of said projections is a crystalline layer having a specific crystal orientation, whereas said projections except for said tip are covered by a layer which is not a candidate of nuclei.

12. An information processing device, comprising:

a semiconductor device having a plurality of transistors formed at a surface of a polycrystalline semiconductor thin film structure formed of an insulating substrate and n polycrystalline layers (n≧2) laminated on said insulating substrate, with crystal grains disseminated on the surface thereof, the number of the crystal grains in each of the polycrystalline layers being gradually reduced from a lower layer to an upper layer, each of said transistors being formed in a region of one of said crystal grains; and a central processing unit, memory circuit, and peripheral circuitry configured by said semiconductor device.

\* \* \* \* \*